United States Patent [19]

Khieu

[11] Patent Number: 5,715,201

[45] Date of Patent: Feb. 3, 1998

[54] SELF-TRACKING DELAY-MATCHING WRITE PULSE CONTROL CIRCUIT AND METHOD

[75] Inventor: Cong Q. Khieu, San Jose, Calif.

[73] Assignee: Intel Corporation, Santa Clara, Calif.

[21] Appl. No.: 773,600

[22] Filed: Dec. 27, 1996

[51] Int. Cl.⁶ .................................................. G11C 7/00
[52] U.S. Cl. ...................... 365/191; 365/194; 365/189.02
[58] Field of Search .................................... 365/191, 194, 365/189.02, 195, 189.11, 233.5, 233

[56] References Cited

U.S. PATENT DOCUMENTS 4,727,519  2/1988  Morton ............................... 365/185.21

*Primary Examiner*—A. Zarabian
*Attorney, Agent, or Firm*—Cynthia Thomas Faatz

[57] ABSTRACT

A self-tracking write pulse control circuit to determine the time provided to complete a write operation to a memory. A tracking array including at least a first tracking memory cell configured on the memory includes an output and stores a default value. First and second bitlines are coupled to the tracking memory cell. A write multiplexor circuit is coupled to the first and second bitlines and coupled to receive an enable signal which concurrently initiates a write pulse. A write multiplexor circuit writes a different value to the tracking memory cell in response to receiving the enable signal. The output of the tracking memory cell transitions to end the write pulse when the different value has been successfully written to the tracking memory cell.

13 Claims, 4 Drawing Sheets

SELF-TRACKING DELAY-MATCHING WRITE PULSE CONTROL CIRCUIT AND METHOD

BACKGROUND OF THE INVENTION

1. Field of the Invention

The invention relates to the field of memory technologies, and more particularly, to controlling the width of a memory write pulse during a memory write operation.

2. Description of Related Art

In integrated circuit manufacturing, a primary goal is to have as high a yield as possible during production testing. A common problem limiting the yield of memories and integrated circuit devices which include embedded memories is the width of the write pulse used to control write operations to a memory. A write operation starts at the beginning of the write pulse, at a rising edge of the pulse, for example, and must be completed before the next falling edge of the write pulse.

For memory write operations, especially in high performance memories or integrated circuits, the write pulse width must be accurately designed and controlled. If the width of the write pulse is too large, the memory write operation will require a longer cycle time such that the performance of the integrated circuit may be adversely impacted. Conversely, if the write pulse width is too small, the memory write operation may not be successfully completed before the end of the write operation and new data will not be written to the memory array successfully.

Prior memories and integrated circuits which include memories have used various approaches to try to address this issue. In one such approach, complicated write control logic separate from, but similar to the write control logic used to write to the memory itself, is used to write to a dummy memory column configured on the memory. The overhead time due to propagation delays through the write control logic in this case, however, is excessive and impacts the performance of the integrated circuit chip.

In another approach, an inverter chain is used to control the write pulse width such that the write pulse is asserted during the length of the propagation delay through the inverter chain. While there is no overhead time associated with the inverter chain approach, this approach also does not track the memory cells such that process variations are accounted for. Thus, for larger process variations, the inverter chain may provide too little or too much delay.

What is needed is an approach to controlling the width of the write pulse for memory write operations which tracks the characteristics of the memory army to be read, and which requires little or no overhead delay such that memory write performance is not adversely impacted.

SUMMARY OF THE INVENTION

A method and apparatus for self-tracking and control of a write pulse signal in order to reliably and efficiently control memory write operations over a wide range of processing variations is described. A first tracking array including at least a first tracking memory cell including an output is configured on the memory and stores a first default value. First and second bitlines are coupled to the tracking memory cell. A write multiplexor circuit is coupled to the first and second bitlines and coupled to receive an enable signal which concurrently initiates the write pulse. The write multiplexor writes a different value to the tracking memory cell in response to receiving the enable signal. The output of the tracking memory cell transitions to end the write pulse when the different value has been successfully written to the tracking memory cell.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are for explanation and understanding only.

DETAILED DESCRIPTION

The present invention relates to a method and apparatus for self-tracking and control of a write pulse controlling a memory write operation in order to provide for reliable, high performance write operations across a wide variety of processing variations. In the following description, numerous specific details such as specific memory write operation control circuitry, numbers of memory cells, and logic and circuit configurations are set forth in order to provide a thorough understanding of the invention. However, it will be appreciated by those skilled in the art that the invention may be practiced without these specific details. In other instances, well-known structures, circuits, logic and steps have not been described in detail in order to avoid obscuring the invention.

The present invention provides a method and apparatus for controlling the width of a memory write pulse to enable reliable memory write operations over a wide range of processing variations while incurring minimal to no overhead delay. The memory write pulse determines the time provided to complete a write operation to a memory array.

The self-tracking write pulse control circuit of the invention includes a tracking memory array including at least a first tracking memory cell which is configured on the memory array to be written using the same process and memory cell configuration used to produce the cells of the memory array. First and second bitlines are coupled to the tracking memory array and a write pass-gate multiplexor is coupled to the first and second bitlines. In response to receiving an enable signal at an input to a write circuit including the self-tracking write pulse control circuit, a write pulse is initiated. Concurrently, the write pass-gate multiplexor writes a logical "1" to the first tracking memory cell in the tracking array in response to the enable signal. Once the write operation to the tracking memory cell is complete, an output of the tracking memory cell transitions causing the write pulse to transition to end the period during which the memory array may be written to.

Because the tracking memory cells of the tracking memory array are produced using the same process and configuration as the memory cells making up the memory array to which data is being written, the time required to write to the tracking memory cell tracks the cell current and bitline capacitance of the cells in the memory array to control the write pulse width. The self-tracking write pulse control circuit of the invention is described in more detail below.

Figure 1:
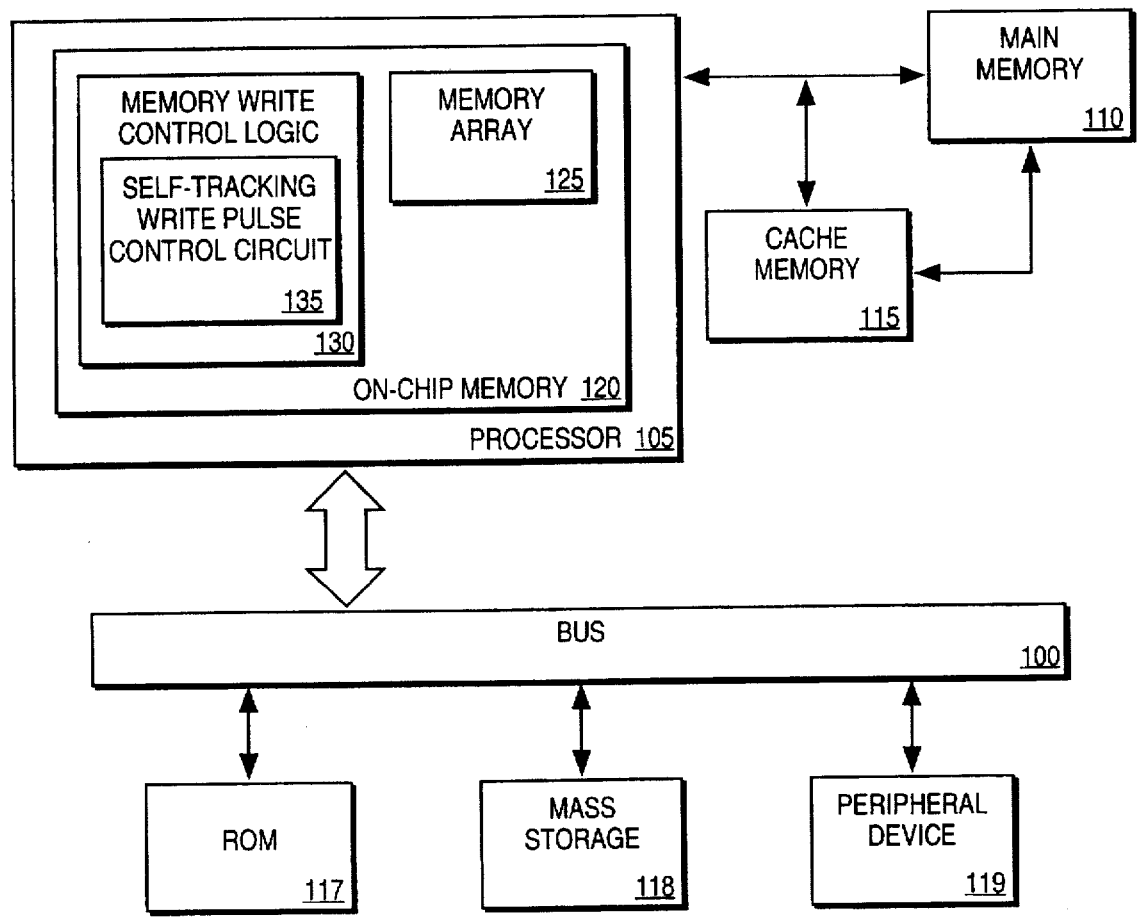
FIG. 1 is a block diagram of a computer system which may advantageously utilize memories which include the self-tracking write pulse control circuit of the invention.

FIG. 1 illustrates a simplified block diagram of a computer system including memories which may advantageously utilize the self-tracking write pulse control circuit of the invention. The computer system includes a bus 100 for communicating information, a processor 105 coupled to the bus for processing information, a main memory 110 coupled to the processor 105 for storing information and instructions for the processor 105 and an external cache memory 115 for storing frequently and/or recently used information for the processor 105.

The computer system also includes read-only memory (ROM) 117 coupled to the bus 100 for storing fixed information for the processor 105, a mass storage device 118 such as a hard disk drive for storing information for the processor 105 and peripheral devices 119 such as input devices, display devices and other computer system peripheral devices.

The processor 105 in this example includes on-chip cache memory 120, also referred to as level one (L1) cache memory. The L1 cache memory 120 is small and provides for very fast access time for a small amount of frequently or recently used information. The on-chip memory 120 includes a cache memory array 125, and memory write control logic 130. The memory write control logic 130 includes the self-tracking write pulse control circuit 135 of the invention in this example. As will be appreciated by those of skill in the art, although the self-tracking write pulse control circuit of the invention is described below as being configured on a memory such as the on-chip memory 120, other memories such as the cache memory 115 and the main memory 110 may also utilize and benefit from the memory write self-tracking circuit of the invention.

Figure 2:
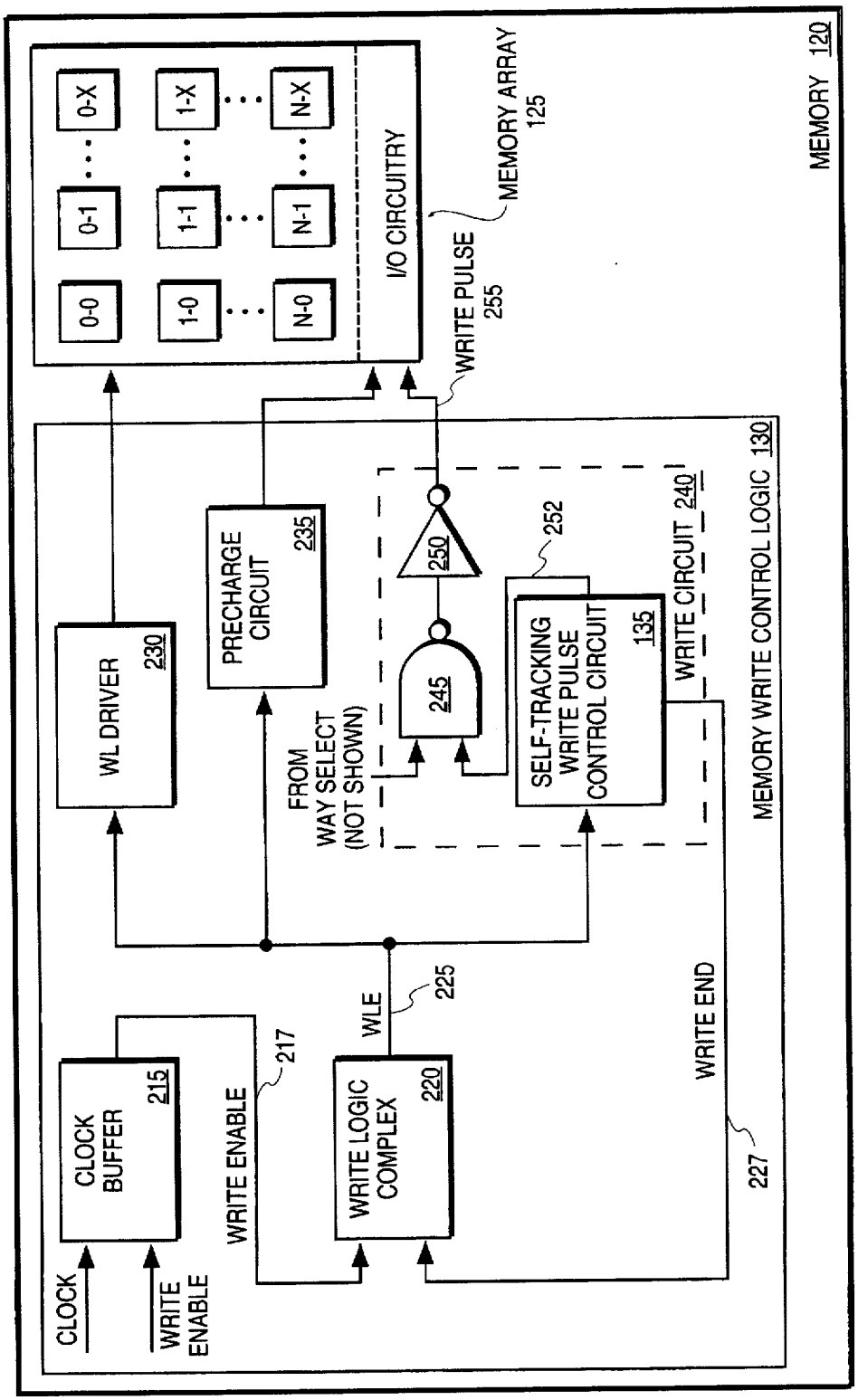
FIG. 2 illustrates a memory including memory control circuitry utilizing the self-tracking write pulse control circuit of one embodiment of the invention.

FIG. 2 illustrates in additional detail the memory 120 including memory write control logic 130 utilizing the self-tracking write pulse control circuit 135 of one embodiment of the invention. The memory array 125 is an X-by-N memory array including X columns and N rows of memory cells where X and N may each be a variety of numbers corresponding to any desired memory array size. The memory array 125 includes input/output (I/O) circuitry 205 which includes sense amplifiers and other circuitry required to perform memory read and write operations.

The memory write control logic 130 is coupled to the memory array 125 in order to control write operations directed to the memory array 125. It will be appreciated by those of skill in the art that the memory write control logic 130 may include other logic such as row and column decoders, for example. Further, it will be appreciated by those of skill in the art that some of the circuits and logic described in reference to the memory write control logic may be shared by memory read control logic. Such elements, along with memory read control logic, address decoders and other circuitry, are not shown or described herein in order to avoid obscuring the present invention.

The memory write control logic 130 in accordance with one embodiment of the invention includes a clock buffer 215 which receives a clock signal and a write enable (WE) signal from sources external to the memory write control logic 130. A WE output 217 of the clock buffer is received at an input of a memory write logic complex 220 to enable a memory write operation on a transitioning clock edge. The memory write logic complex 220 includes combinatorial logic and may receive other WE inputs (not shown), other than the WE input 217 from the clock buffer 215, which control writing to the memory array 125.

The write logic complex 220 is typically combined with read logic which is not shown. The write logic complex 220 provides a wordline enable (WLE) signal 225 at its output in response to a write enable signal generated following a valid request to write data to the memory array 125. The memory write request may be received from any number of sources on the processor 105 of FIG. 1. The write logic complex also receives a write end signal 227 from the self-tracking write pulse control circuit. The write end signal 227 signifies the end of a write operation and causes the write logic complex 220 to deassert the WLE signal 225 which in the examples below is active low.

The output of the write logic complex 220 is coupled to an input of a wordline (WL) driver 230, a precharge circuit 235, and a write circuit 240. The WL driver 230 initiates a memory write cycle in response to the WLE signal 217 being asserted by driving a selected wordline in the memory array 125, the selected wordline corresponding to a memory row including a memory cell to be written to. The precharge circuit 235 turns off precharge circuitry in response to the WLE signal being asserted such that the memory may be read. Precharging circuitry may not be used during write operations for some memories.

The write circuit 240 includes the self-tracking write pulse control circuit 135 and combinatorial logic including a NAND gate 245 and an inverter 250 coupled to the NAND gate 245 to form a logical AND circuit. A first input of the NAND gate 245 receives a signal from a way select circuit (not shown) in one embodiment. In this example, several different NAND gate/inverter pairs such as the NAND gate 245 and the inverter 250 may be used to correspond to different ways of the memory array 125 to be written to if the memory array 125 is a set associative cache memory array for example. In this case, the output 252 is also coupled to one input of each of the other NAND gates with the other inputs of each of the NAND gates being supplied by different way select signals. In other embodiments which do not utilize different ways of memory, the NAND gate 245 and the inverter 250 may not be present or may be replaced by other combinatorial logic.

Assuming the selected way is associated with the NAND gate 245 and the inverter 250, the first input of the NAND gate is asserted when a memory write operation is received. A second input of the NAND gate 245 receives the output 252 of the self-tracking write pulse control circuit 135. In this manner, the write pulse 255 which controls the amount of time provided to write to a memory cell, is controlled by both a write signal and the output of the self-tracking write pulse control circuit 135 as described below.

Figure 3:
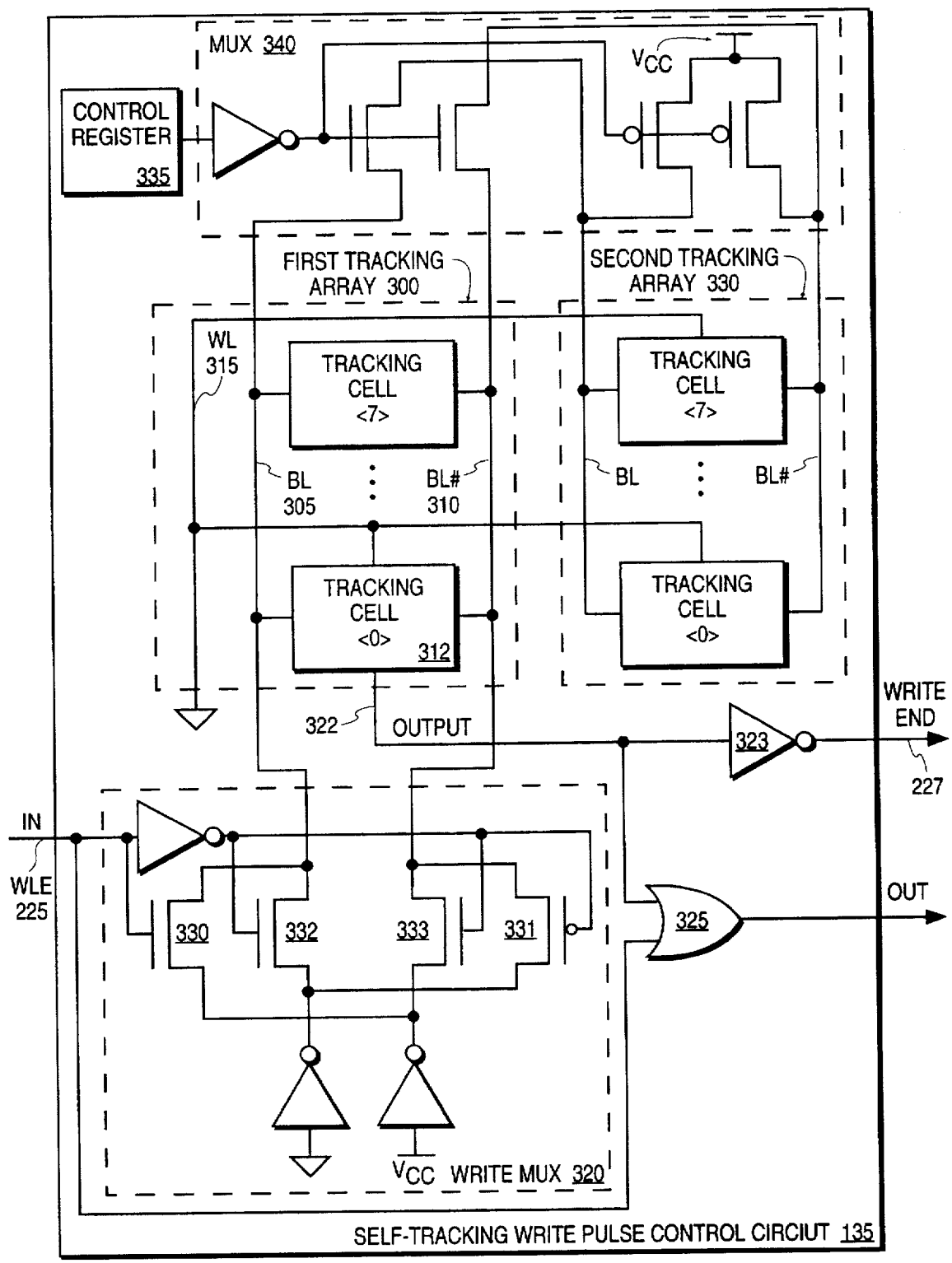
FIG. 3 illustrates the self-tracking write pulse control circuit of one embodiment of the invention.

The self-tracking write pulse control circuit of the invention is illustrated and described in more detail in reference to FIG. 3. The self-tracking write pulse control circuit 135 includes a first array of self-tracking or simply tracking memory cells 300. In one embodiment, there are 8 memory cells (cells 0..7) in the first array 300 although a different number of tracking memory cells may be used in other embodiments. The number of tracking memory cells in the first tracking array 300 is selected to be small enough to provide enough driving capability to produce a detectable output signal and to minimize the space taken up by the memory read self-tracking circuit, but large enough to ensure that the current, power, capacitance and other characteristics of the memory array 125 are tracked closely.

The tracking cells of the first tracking array 300 are configured to store a logical 0 as a default value upon resetting the tracking memory array 300 following a write pulse. Thus, the tracking cells of the first tracking array 300 store a logical 0 at all times except when a write pulse is active in accordance with one embodiment of the invention. The operation of the tracking memory cells is described in more detail below.

Each of the tracking cells in the first tracking array 300 is coupled to a pair of bitlines including a first bitline (BL) 305 and a second bitline (BL#) 310. The wordlines (WL) 315 of the cells in the first tracking array 300 are tied to ground. The BL 305 and BL# 310 of the first tracking array 300 are coupled to a write multiplexor 320 which is configured in one embodiment as shown in FIG. 3. The write multiplexor 320 is a simple circuit configured as a pass-gate multiplexor as shown. A first device 330 has a gate coupled to receive the WLE signal 225, one terminal coupled to ground and an opposite terminal coupled to the BL 305. A second device 331 has a gate coupled to receive the complement of the WLE signal 225, one terminal coupled to Vcc and an opposite terminal coupled to the BL# 310. A third device 332 is coupled to receive the complement of the WLE signal 225 at its gate, has one terminal coupled to the BL 305 and an opposite terminal coupled to Vcc. A fourth device 333 is also coupled to received the complement of the WLE signal 225 at its gate, but has one terminal coupled to the BL# 310 and the other terminal coupled to ground. In this manner, when the WLE signal is not asserted (since the WLE signal in this example is active low for a write cycle, this would mean that the WLE signal is high), the tracking cell 312 and other cells in the tracking array 300 store a logical "0" and the write multiplexor writes a logical "1" to the tracking memory cells when WLE is asserted. The write multiplexor 320 takes up little space and incurs very little propagation delay in comparison to the WL driver 230 and the precharge circuit 235 coupled to the memory array 125 in FIG. 2.

An output of one of the tracking memory cells 312 is coupled to an inverter 323 having an output coupled to provide the write end signal 227 and to one input of a two input NOR gate 325. The second input of the NOR gate 325 is coupled to receive the WLE signal 225. An output of the NOR gate 325 is coupled to provide an output signal 252 (also shown in FIG. 2). It will be appreciated by those of skill in the art that other combinatorial logic configurations which achieve the same result as achieved by the combinatorial logic shown in FIGS. 2 and 3 are also within the scope of the invention. Thus, the self-tracking write pulse control circuit 135 of the invention is a relatively simple and small circuit taking up little space.

The operation of the self-tracking write pulse control circuit 135 is described in reference to FIGS. 2 and 3. Referring first to FIG. 2, a write enable signal is received by the clock buffer 215 in response to a memory write request from other circuitry on the processor 105 (FIG. 1), for example. The clock buffer 215 then outputs a write enable signal 217 on a transitional edge of a clock signal. The write logic complex 220 outputs a word line enable (WLE) signal 225 in response to receiving the write enable signal 217. The WLE signal is simultaneously received at the WL driver 230, the precharge circuit 235 and the write circuit 240 including the self-tracking write pulse control circuit 135.

In response to receiving the WLE signal 225, the WL driver 230 asserts a selected wordline of the memory array 125 and the precharge circuit 235 deactivates the precharge circuitry of the memory array 125. Concurrently, the WLE signal, which is active low in one embodiment, is received at an input of the self-tracking write pulse control circuit 135. At the same time, assuming that the memory cell to be written to corresponds to an area of the memory array 125 controlled by the NAND gate 245 and the OR gate 250, the first input of the NAND gate received from the decoder is asserted.

Referring to FIG. 3, the tracking memory cell 312 stores a logical "0" as a default value as described above and thus, when the WLE signal 225 is initially asserted (i.e. low), the output 252 is high. In this manner, the output of the NAND gate 245 is high causing a write pulse 255 to be initiated (i.e. the write pulse 255 transitions to an active state (high) to allow writing of the memory array 125 in FIG. 2) in response to receiving the WLE signal and an input from the decoder at the write circuit 240.

As the WLE signal is received at the combinatorial logic of the self-tracking write pulse control circuit 135 to initiate the write pulse, it is also received at an input to the write pass gate multiplexor (mux) 320. Receipt of the WLE signal 225 by the write pass gate mux 320 in FIG. 3, since it is active low in this embodiment, turns the devices 330 and 331 off and the devices 332 and 333 on. In this manner, the BL 305 is pulled to Vcc while the BL# is pulled to ground such that a logical "1" is written to the tracking memory cell 312. Once the logical "1" has been successfully written to the tracking memory cell 312, the output of the tracking cell 312 transitions to a "1" such that the output of the NOR gate 325 (the output 252) is a "0". When the output signal 252 transitions to a low value, the write pulse 255 is terminated (i.e. transitions to an inactive state disabling writing of the memory array 125 in FIG. 2).

Transition of the output of the tracking cell 312 to a high value also causes the write end signal 227 to be asserted. The write end signal 227 is received by the write logic complex 220 which deasserts the WLE signal 225 in response to receiving the write end signal 227 such that the memory write cycle is terminated. Upon terminating the write cycle and deasserting the WLE signal 225, a logical "0" is written back to the tracking memory cell 312 by the write mux circuit 320. When the WLE signal is deasserted, the BL 305 is pulled to ground and the BL# 310 is pulled to Vcc writing a logical "0" to the tracking memory cell 312 such that the tracking array 300 is reset and ready to control the width of the next write pulse. In this manner, the width of the write pulse is controlled with little overhead delay.

Because the tracking memory cell 312 is formed with the same process and using the same configuration as the memory cells in the memory array 125, if the time required to write to memory cells in the memory array 125 is longer than expected due to process variations, the time required to write to the tracking memory cell 312 will also be longer. In this manner, the write pulse width is controlled to be wider to provide enough time to complete a write operation, but with little additional overhead.

Referring again to FIG. 3, in an alternate embodiment, additional tracking arrays, such as the second tracking array 330 may be selectively enabled to add more bitline capacitance to the self-tracking write pulse control circuit, thereby increasing delay and widening the pulse width. In this manner, minor adjustments can be made to the self-tracking write pulse control circuit in the case of large process variations. The second tracking array 330 is selectively enabled by programming a control register 335 to control a multiplexor (mux) 340. One possible configuration of the mux 340 is shown in FIG. 3, however other configurations which provide similar functionality are within the scope of the invention. The operation of the mux 340 will be understood by those of skill in the art from the configuration shown in FIG. 3.

The mux 340 then determines which tracking arrays are enabled if more than one tracking array is provided. The control register 335 may be programmed through a basic input/output system (BIOS) configuration routine stored in the ROM 117 (FIG. 1) or another configuration step. The second tracking array 330 is configured in a similar manner to the first tracking array 300 as shown such that both tracking memory arrays together are used to track the memory array 125 and control the write pulse 255. It will be appreciated by those of skill in the art that additional tracking arrays may be enabled and utilized in a similar manner.

It will also be appreciated by those of skill in the art that other configurations of the write mux circuit which perform the same function without imposing significant additional delays are also within the scope of the invention. Further, a larger or smaller number of tracking memory cells and/or arrays may be used in accordance with the invention to implement the self-tracking write pulse control circuit of the invention and more than one cell in the tracking memory array may be written to concurrently to provide an additional level of control and certainty. Also, while the tracking memory cell described above stores a logical "0" as a default value, a tracking memory cell storing a logical "1" as a default value with the circuitry of the write mux changed to write a logical "0" to the tracking cell when a write is enabled is also within the scope of the invention. Similarly, the write logic complex may be changed to provide an active high WLE signal with the combinatorial logic changed to provide the functionality described above.

The self-tracking write pulse control circuit of the invention provides several advantages over prior approaches. The self-tracking write pulse control circuit tracks the cell current and bitline capacitance of memory cells in a memory array such that variations in processing conditions which cause the time required to write to the memory array to be slower or faster also affect the self-tracking circuit in the same way. In this manner, the width of the write pulse can be controlled over a wide range of processing and power supply variations to provide sufficient time to reliably complete a write operation. Further, the self-tracking write pulse control circuit of the invention is simple and does not include complex write control logic thereby keeping additional overhead in the write pulse very low even with processing variations.

Based on the simplicity of the self-tracking circuit, there is also a lower probability of design or processing errors causing the circuit to fail during manufacturing or use. The self-tracking write pulse control circuit further strikes a balance between small size such that it takes up very little room on a memory chip, while a sufficient number of tracking memory cells are provided to track the memory array closely enough to provide reliable memory write performance over a wide range of process variations.

Figure 4:
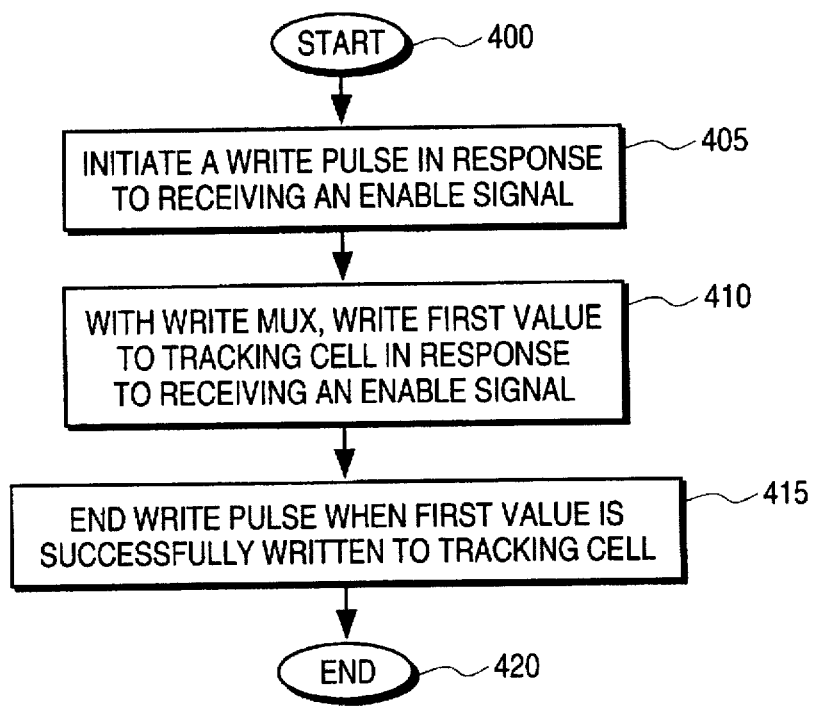
FIG. 4 is a flow diagram illustrating the memory write pulse self-tracking method of one embodiment of the invention.

FIG. 4 illustrates the write pulse width control method of one embodiment of the invention which begins at step 400. In step 405, a write pulse is initiated in response to receiving an enable signal from write control logic following a memory write request. In step 410, using a write pass-gate multiplexor, a first value is written to a tracking memory cell in response to receiving the enable signal. The first value written to the tracking memory cell is different from a second default value which is stored in the tracking memory cell. In step 415, when the first value is successfully written to the tracking memory cell, the write pulse is terminated and the method ends in step 420. In this manner, the method of the invention controls the width of the write pulse which determines the time provided to write to a memory array.

Thus, a method and apparatus for self-tracking of a write pulse signal during a memory write operation in order to provide for reliable memory write operations across a wide variety of processing variations is described. Whereas many alterations and modifications of the invention may occur to one of ordinary skill in the art after having read the foregoing description, it is to be understood that the particular embodiments shown and described by way of illustration are in no way intended to be considered limiting. Therefore, references to details of various embodiments are not intended to limit the scope of the claims which in themselves recite only those features regarded as essential to the invention.

I claim:

1. An apparatus for controlling the width of a write pulse to determine the time provided to complete a write operation to a memory, the apparatus comprising:

a first tracking array including at least a first tracking memory cell configured on the memory and storing a first value, the tracking memory cell having an output, the tracking memory cell being formed the same way as memory cells forming the memory;

first and second bitlines coupled to the tracking memory cell; and a write multiplexor circuit coupled to the first and second bitlines and coupled to receive an enable signal, the enable signal initiating the write pulse, the write multiplexor writing a different value to the tracking memory cell in response to receiving the enable signal, the output of the tracking memory cell transitioning to end the write pulse when the different value has been successfully written to the tracking memory cell.

2. The apparatus as set forth in claim 1 wherein the first tracking memory array includes 8 tracking memory cells.

3. The apparatus as set forth in claim 1 wherein a default value for the tracking memory cell is a logical "0" and the different value is a logical "1".

4. The apparatus as set forth in claim 1 further including:

a multiplexor coupled to the first tracking memory array, a second array of tracking memory cells coupled to the multiplexor, and a programmable register to control the multiplexor such the second array can be selectively utilized.

5. The apparatus as set forth in claim 1 wherein the memory to be written to includes a first number of memory cells in a memory column and the first tracking memory array includes a smaller number of tracking memory cells than the first number and greater than one.

6. The apparatus as set forth in claim 1 wherein the output of the tracking memory cell is further coupled to provide a write end signal when the tracking memory cell transitions in response to the different value being successfully written.

7. A memory for use in a computer system, the memory comprising:

a memory array;

an input to receive a memory write request;

logic to generate a wordline enable signal in response to the memory write request; and a memory write control unit including:

a first tracking array including at least a first tracking memory cell configured on the memory and storing a default value, the tracking memory cell having an output, first and second bitlines coupled to the tracking memory array, and a write multiplexor circuit coupled to the first and second bitlines and coupled to receive an enable signal, the enable signal initiating a write pulse, the write multiplexor writing a different value to the tracking memory cell in response to receiving the enable signal, the output of the tracking memory cell transitioning to end the write pulse when the different value has been successfully written to the tracking memory cell.

8. The memory as set forth in claim 7 wherein the default value is a logical "0" and the different value is a logical "1".

9. The memory as set forth in claim 7 further including:

a multiplexor coupled to the first tracking memory array, a second tracking array coupled to the multiplexor, and a programmable register to control the multiplexor such the second array can be selectively utilized.

10. The memory as set forth in claim 7 wherein the output of the tracking memory cell is further coupled to provide a write end signal when the tracking memory cell transitions in response to the different value being successfully written.

11. A method for controlling the width of a write pulse, the method comprising the steps of:

initiating a write pulse in response to receiving an enable signal indicating a beginning of a write cycle;

a write multiplexor writing a first value to a first tracking memory cell which is different than a default value stored in the tracking memory cell in response to receiving the enable signal; and ending the write pulse when the first value is successfully written to the tracking memory cell.

12. The method as set forth in claim 11 further including the step of disabling the enable signal to end the write cycle when the first value is successfully written to the tracking memory cell.

13. The method as set forth in claim 11 wherein the first tracking memory cell is in a first tracking memory array, the method further including a step of enabling a second tracking memory array.

* * * * *

UNITED STATES PATENT AND TRADEMARK OFFICE
CERTIFICATE OF CORRECTION

PATENT NO.    : 5,715,201
DATED         : February 3, 1998
INVENTOR(S)   : Cong Q. Khieu It is certified that error appears in the above-identified patent and that said Letters Patent is hereby corrected as shown below:

In column 1 at line 51 delete "army" and insert --array--

Signed and Sealed this

Twenty-fifth Day of August, 1998

Attest:

Attesting Officer

BRUCE LEHMAN

Commissioner of Patents and Trademarks